ced by examiner

United States Patent
Cho et al.

(10) Patent No.: US 8,034,683 B2
(45) Date of Patent: Oct. 11, 2011

(54) METHOD OF FORMING A PHASE CHANGE MATERIAL LAYER, METHOD OF FORMING A PHASE CHANGE MEMORY DEVICE USING THE SAME, AND A PHASE CHANGE MEMORY DEVICE SO FORMED

(75) Inventors: Sung-Lae Cho, Yongin-si (KR); Choong-Man Lee, Seoul (KR); Jin-Il Lee, Seongnam-si (KR); Sang-Wook Lim, Yongin-si (KR); Hye-Young Park, Seongnam-si (KR); Young-Lim Park, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1102 days.

(21) Appl. No.: 11/785,807

(22) Filed: Apr. 20, 2007

(65) Prior Publication Data

US 2007/0246743 A1 Oct. 25, 2007

(30) Foreign Application Priority Data

Apr. 21, 2006 (KR) .................. 10-2006-0036209

(51) Int. Cl.
*H01L 21/44* (2006.01)

(52) U.S. Cl. . 438/253; 438/238; 438/381; 257/E21.257; 257/E21.585; 257/E23.145; 257/E45.002

(58) Field of Classification Search .................. None
See application file for complete search history.

(56) References Cited

U.S. PATENT DOCUMENTS

| 6,545,287 | B2 | 4/2003 | Chiang |
| 6,566,700 | B2 | 5/2003 | Xu |
| 6,759,267 | B2 | 7/2004 | Chen |
| 7,473,597 | B2 * | 1/2009 | Lee et al. .................. 438/253 |
| 7,663,136 | B2 * | 2/2010 | Park et al. .................. 257/5 |
| 2006/0006472 | A1 | 1/2006 | Jiang |
| 2006/0039192 | A1 | 2/2006 | Ha et al. |
| 2006/0076641 | A1 | 4/2006 | Cho et al. |

FOREIGN PATENT DOCUMENTS

| KR | 10-2001-0004719 | 1/2001 |
| KR | 10-2004-0044882 A | 5/2004 |
| KR | 10-2006-0016418 A | 2/2006 |
| KR | 10-2006-0018172 A | 2/2006 |

\* cited by examiner

*Primary Examiner* — Zandra Smith
*Assistant Examiner* — Pamela E Perkins
(74) *Attorney, Agent, or Firm* — Lee & Morse, P.C.

(57) ABSTRACT

A method of forming a phase change material layer includes preparing a substrate having an insulator and a conductor, loading the substrate into a process housing, injecting a deposition gas into the process housing to selectively form a phase change material layer on an exposed surface of the conductor, and unloading the substrate from the process housing, wherein a lifetime of the deposition gas in the process housing is shorter than a time the deposition gas takes to react by thermal energy.

20 Claims, 8 Drawing Sheets

METHOD OF FORMING A PHASE CHANGE MATERIAL LAYER, METHOD OF FORMING A PHASE CHANGE MEMORY DEVICE USING THE SAME, AND A PHASE CHANGE MEMORY DEVICE SO FORMED

BACKGROUND OF THE INVENTION

1. Field of the Invention

Embodiments of present invention relate to a method of forming a phase change material layer, a method of forming a phase change memory device using the same, and a phase change memory device so formed. More particularly, embodiments of the present invention relate to a method of forming a phase change material layer, a method of forming a phase change memory device using the same, and a phase change memory device so formed that may reduce or eliminate the formation of voids or seams in a phase change material layer.

2. Description of the Related Art

Among semiconductor devices, a phase change memory device has a nonvolatile characteristic, such that stored data are not lost even if a supply of power is interrupted. The phase change memory device may employ a phase change material layer that may exhibit two stable states for storing data. The phase change material layer may be transformed into amorphous state or crystalline state according to a heating temperature and duration. Typically, the phase change material layer in an amorphous state has a higher resistivity than the phase change material layer in a crystalline state. Thus, using the change of the resistivity according to the state of the phase change material layer, it is possible to store data of logic "1" or "0" in a unit cell of the phase change memory device.

Joule heating may be used as the means of heating the phase change material layer to change the state thereof. For example, Joule heating may be generated around the phase change material layer by applying a current to electrodes connected to the phase change material layer. By adjusting the amount and/or duration of applied current to control the temperature and/or duration of the generated Joule heating, it is possible to perform a program or erase operation, i.e., to transform the phase change material layer into an amorphous or crystalline state.

Generally, a high temperature is required for transforming the state of the phase change material layer. For instance, it may be necessary to apply a temperature of about 630° C., near the melting temperature, for a Ge—Sb—Te (GST) layer to transform the GST layer into the amorphous state. A significant amount of current may be required to generate this much heat. Accordingly, the phase change memory device may exhibit a large power consumption. In addition, it may be difficult to highly integrate the phase change memory device, because a channel width of a MOS transistor in the phase change memory device may need to be increased in order to control the high current.

The amount of current used in a program and/or erase operation may be reduced by reducing the size of a contact area between the phase change material layer and an electrode connected thereto. By reducing the size of the contact area, a density of current flowing through the contact area may be increased, which may allow the amount of current used in the program and/or erase operation to be reduced. As the phase change material layer may be formed by depositing the phase change material layer in a hole that exposes the electrode, it will be appreciated that reducing the size of the contact area may require reducing a diameter of the hole, which may result in an aspect ratio of the hole being increased.

If the phase change material layer is deposited in the hole by blanketing the phase change material on the entire surface of the substrate, an overhang may develop at an upper portion of the hole, leading to a void in the phase change material below the overhang. Further, a seam may be formed where phase change material deposited on one sidewall of the hole contacts phase change material deposited on an opposite sidewall.

Voids and seams may degrade the operational characteristics of the phase change material layer. For example, a portion of the phase change material layer where the void or seam is formed may have a very high resistance, which may make detecting changes in resistance due to transformations between the crystalline and amorphous states difficult or impossible to sense accurately. Thus, a sensing margin of the phase change memory device may decrease. In addition, voids and seams may reduce the uniformity of unit cells in a phase change memory device, such that programming resistances, erasing resistances, the amount of program and erase current, etc., may be non-uniform, degrading the operation of the phase change memory device.

SUMMARY OF THE INVENTION

The present invention is therefore directed to a method of forming a phase change material layer, a method of forming a phase change memory device using the same, and a phase change memory device so formed, which substantially overcome one or more of the problems due to the limitations and disadvantages of the related art.

It is therefore a feature of an embodiment of the present invention to provide a method of forming a phase change material layer that may selectively form the phase change material layer on a conductive feature.

It is therefore another feature of an embodiment of the present invention to provide a method of forming a phase change material layer that may form the phase change material layer on the conductive feature without forming the phase change material on an adjacent insulator, which may eliminate the formation of overhangs, seams and/or voids in the phase change material layer.

It is therefore a further feature of an embodiment of the present invention to provide a phase change memory device having a phase change material layer that is uniformly formed and has a small contact area, such that the phase change memory device may be used for a highly integrated, low power consumption memory.

At least one of the above and other features and advantages of the present invention may be realized by providing a method of forming a phase change material layer, including preparing a substrate having an insulator and a conductor, loading the substrate into a process housing, injecting a deposition gas into the process housing to selectively form a phase change material layer on an exposed surface of the conductor, and unloading the substrate from the process housing, wherein a lifetime of the deposition gas in the process housing is shorter than a time the deposition gas takes to react by thermal energy.

The deposition gas may react by excess electrons in the conductor to form the phase change material layer, and the phase change material layer may be grown upward from the exposed surface of the conductor. The lifetime of the deposition gas in the process housing may be longer than a time the deposition gas takes to react by the excess electrons in the conductor. The insulator may cover the entire surface of the substrate, and the conductor may be exposed by a hole penetrating the insulator, a surface of the conductor exposed by the hole being lower than a top surface of the insulator. The deposition gas may include a plurality of source gases, and the source gases may be simultaneously injected into the process housing. The deposition gas may include a plurality of source gases that are divided into a plurality of gas groups each having at least one source gas, the gas groups may be injected into the process housing in sequence, and the method may further include, after the injecting of the respective gas groups into the process housing, purging the process housing with a purge gas containing an inert gas. The insulator may be formed of at least one selected from the group consisting of a silicon-based insulating layer containing silicon and a metal-based insulating layer containing metal. The phase change material layer may include at least one of tellurium (Te) and selenium (Se), and at least one of Ge, Sb, Bi, Pb, Sn, Ag, As, S, Si, P, O and N.

At least one of the above and other features and advantages of the present invention may also be realized by providing a method of forming a phase change memory device, including forming an interlayer insulating layer covering an entire surface of a substrate, wherein a lower electrode is exposed by a hole penetrating the interlayer insulating layer, growing a phase change material layer upward from the exposed surface of the lower electrode using a selective deposition so as to form a phase change pattern to fill the hole over the exposed surface of the lower electrode, and forming an upper electrode on the interlayer insulating layer and in contact with the phase change pattern, wherein the selective deposition may include injecting a deposition gas into a process housing in which a deposition process is performed, and a lifetime of the deposition gas in the process housing may be shorter than a time the deposition gas takes to react by thermal energy.

The deposition gas may react by excess electrons in the lower electrode to form the phase change material layer. The lifetime of the deposition gas in the process housing may be longer than a time that the deposition gas takes to react by the excess electrons in the lower electrode.

Forming the interlayer insulating layer and the lower electrode may include forming the lower electrode on a predetermined region of the substrate, forming the interlayer insulating layer on the substrate having the lower electrode, and patterning the interlayer insulating layer to form the hole exposing the lower electrode. The lower electrode may be formed of a conductive material having a resistivity that is different from that of the upper electrode. Forming the interlayer insulating layer and the lower electrode may include forming the interlayer insulating layer on the substrate, patterning the interlayer insulating layer to form a hole, forming a preliminary lower electrode in the shape of a plug to fill the hole, and etching the preliminary lower electrode to form the lower electrode, the lower electrode filing a lower portion of the hole. The method may further include, before forming the interlayer insulating layer, forming a buffer pattern on a predetermined region of the substrate, wherein the hole may expose the buffer pattern, and the lower electrode may be formed on the buffer pattern exposed by the hole, the buffer pattern being formed of a conductive material having a resistivity that is lower than that of the lower electrode. The lower electrode may be formed of a conductive material having a resistivity that is different from that of the upper electrode.

One sheet of the substrate may be loaded on a chuck disposed in the process housing, and the selective deposition may be a single wafer-type selective deposition. A plurality of sheets of substrates may be loaded on a substrate support unit disposed in the process housing, and the selective deposition may be a batch-type selective deposition. The deposition gas may include a plurality of source gases, and the sources gases may be simultaneously injected into the process housing. The deposition gas may include a plurality of source gases that are divided into a plurality of gas groups each having at least one source gas, the gas groups may be injected into the process housing in sequence, and the method may further include, after the injecting of the respective gas groups into the process housing, purging the process housing with a purge gas containing an inert gas.

Forming the phase change pattern may include forming the phase change material layer in the hole such that a lower portion of the phase change material layer fills the hole and an upper portion of the phase change material layer is disposed on the lower portion, the upper portion protruding higher than a top surface of the interlayer insulating layer, and planarizing the protruding upper portion of the phase change material layer to form the phase change pattern. The interlayer insulating layer may be formed of at least one of a silicon-based insulating layer containing silicon and a metal-based insulating layer containing metal. The phase change pattern may include at least one of tellurium (Te) and selenium (Se), and at least one of Ge, Sb, Bi, Pb, Sn, Ag, As, S, Si, P, O and N.

At least one of the above and other features and advantages of the present invention may further be realized by providing a phase change memory device, including a lower electrode disposed on a predetermined region of a substrate, an interlayer insulating layer covering an entire surface of the substrate and having a hole exposing the lower electrode, a phase change pattern filling the hole over the exposed surface of the lower electrode without a void or a seam, and an upper electrode disposed on the interlayer insulating layer and in contact with the phase change pattern.

The phase change pattern may be grown upward from the surface of the lower electrode exposed by the hole using a selective deposition. The selective deposition may include injecting a deposition gas into a process housing in which a deposition process is performed, a lifetime of the deposition gas in the process housing may be shorter than a time the deposition gas takes to react by thermal energy, and the deposition gas may react by excess electrons in the lower electrode so as to form the phase change pattern. The interlayer insulating layer may cover the lower electrode, the hole may expose a surface of the lower electrode, and the exposed surface of the lower electrode may be as high as or lower than a bottom surface of the interlayer insulating layer around the hole. The lower electrode may be formed of a conductive material having a resistivity that is different from that of the upper electrode. The lower electrode may be confined to a lower portion of the hole, and the phase change pattern may fill the hole over the lower electrode.

The phase change memory device may further include a buffer pattern between the lower electrode and the substrate, and between the substrate and the interlayer insulating layer adjacent to the lower electrode, wherein the buffer pattern may be in contact with the lower electrode, and the buffer pattern may be formed of a conductive material having a resistivity that is lower than that of the lower electrode. The lower electrode may be formed of a conductive material having a resistivity that is different from that of the upper electrode. The resistivity of the lower electrode may be higher than the resistivity of the upper electrode. The interlayer insulating layer may be formed of at least one of a silicon-based insulating layer containing silicon and a metal-based insulating layer containing metal. The phase change pattern may include at least one of tellurium (Te) and selenium (Se), and at least one of Ge, Sb, Bi, Pb, Sn, Ag, As, S, Si, P, O and N.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
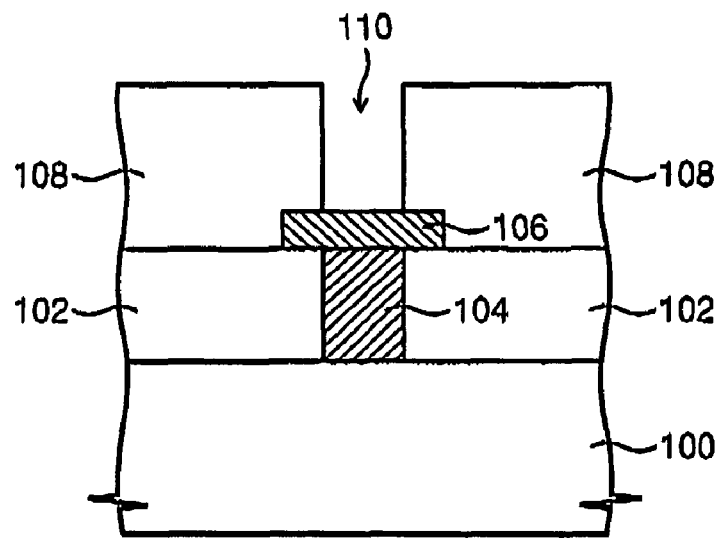
FIGS. 1 through 3 illustrate cross-sectional views of stages in a method of forming a phase change memory device according to a first embodiment of the present invention.

Korean Patent Application No. 2006-36209, filed on Apr. 21, 2006, in the Korean Intellectual Property Office, and entitled: "Method of Forming Phase Change Material Layer, Method of Forming Phase Change Memory Device Using the Same and Phase Change Memory Device So Formed," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. When a layer is referred to as being "in contact" with another layer, it will be understood that the layers may be in electrical contact, even if one or more intervening layers are present, unless expressly stated otherwise. Like reference numerals refer to like elements throughout.

Embodiments of present invention relate to a phase change memory device and method of forming the same, which may reduce or eliminate the formation of voids or seams in a phase change material layer by forming the phase change material layer using a selective deposition method, wherein a deposition gas reacts by means of excess electrons in a base layer to form the phase change material layer, and wherein a lifetime of the deposition gas is shorter than a thermal reaction time. The lifetime of the deposition gas is defined as the time that the deposition gas exists in a process housing, and the thermal reaction time of the deposition gas is defined as the time the deposition gas takes to react by means of thermal energy. Where the lifetime of the deposition gas is shorter than the thermal reaction time, the deposition gas does not react by thermal energy. An electron reaction time is defined as the time the deposition gas takes to react by means of the excess electrons in the base layer. The electron reaction time may be significantly shorter than the thermal reaction time, and the lifetime of the deposition gas may be longer than the electron reaction time. Accordingly, embodiments of the present invention may provide a phase change material layer formed without either void or seam, which are problems that are prevalent in conventional methods. Therefore, embodiments of the present invention may provide a phase change memory device exhibiting excellent operating characteristics and which may be suitable for a high degree of integration and/or low power consumption.

Figure 2:
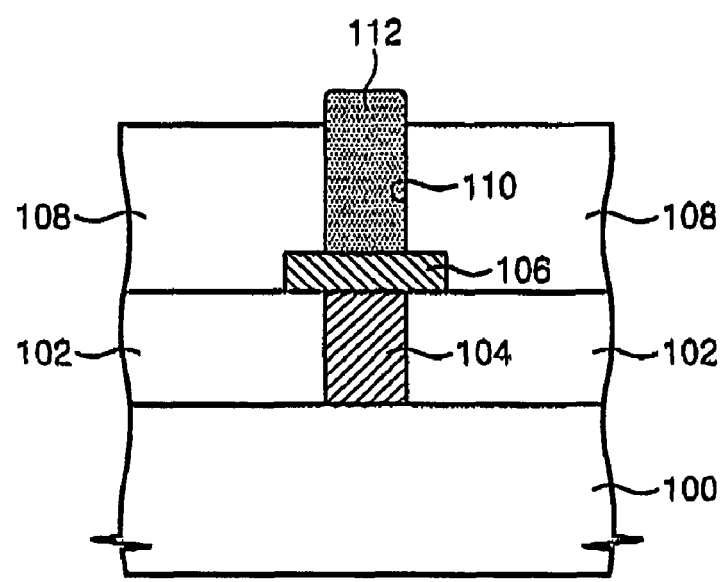
Figure 3:
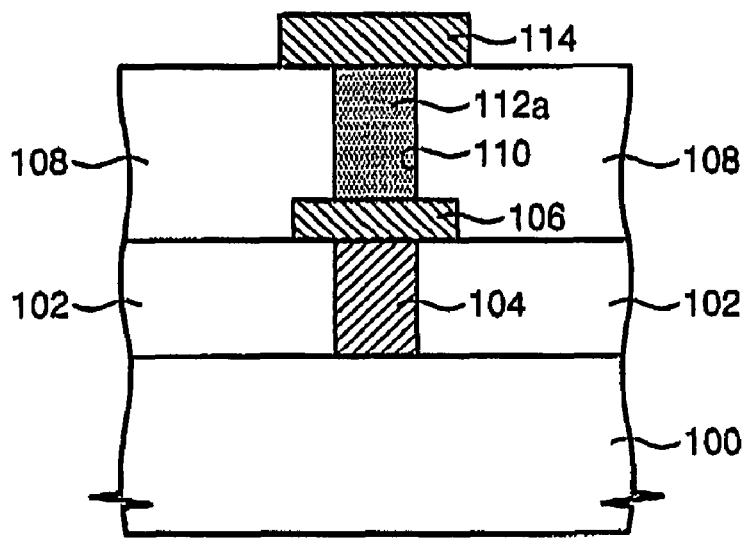

FIGS. 1 through 3 illustrate cross-sectional views of stages in a method of forming a phase change memory device according to a first embodiment of the present invention. Referring to FIG. 1, a lower insulating layer 102 may be formed on a substrate 100, which may be, e.g., a semiconductor substrate. The lower insulating layer 102 may be formed of, e.g., an oxide layer. A lower plug 104 may be formed through the lower insulating layer 102. The lower plug 104 may be in contact with the substrate 100. The lower plug 104 may be formed of, e.g., a conductive material such as doped polysilicon, a metal such as tungsten, a conductive metal nitride such as titanium nitride or tantalum nitride, a metal silicide such as tungsten silicide or titanium silicide, etc.

A switching device may be formed on the substrate 100 to be in contact with the lower plug 104. For example, one end of a PN diode may be formed on the substrate 100 to be in contact with the lower plug 104. In another implementation, source/drain regions of a metal oxide semiconductor (MOS) transistor may be formed on the substrate 100 to be in contact with the lower plug 104.

A lower electrode 106 may be formed on the lower insulating layer 102. The lower electrode 106 may be in contact with the lower plug 104. An interlayer insulating layer 108 may be formed on the substrate 100 and on the lower electrode 106. The interlayer insulating layer 108 may be patterned so as to form a hole 110 exposing the lower electrode 106. The lower electrode 106 may be formed of a conductive material such as, e.g., a transition metal, a conductive transition metal nitride, a conductive ternary nitride, etc. The transition metal may include, e.g., one or more of titanium (Ti), zirconium (Zr), hafnium (Hf), vanadium (V), niobium (Nb), tantalum (Ta), or tungsten (W). The conductive transition metal nitride may include, e.g., one or more of titanium nitride, hafnium nitride, vanadium nitride, niobium nitride, tantalum nitride, or tungsten nitride. The conductive ternary nitride may include, e.g., one or more of titanium aluminum nitride, titanium carbon nitride, tantalum carbon nitride, titanium silicon nitride, or tantalum silicon nitride.

The interlayer insulating layer 108 may be formed of insulating material, e.g., one or more of a silicon-based insulating layer such as a silicon nitride layer, a silicon oxide layer or a silicon oxynitride layer, or a metal-based insulating layer including, e.g., aluminum oxide, tantalum oxide, or hafnium oxide, etc.

According to the first embodiment of the present invention, a phase change material layer 112 may be formed using a selective deposition method on a surface of the lower electrode 106 that is exposed by the hole 110. The phase change material layer 112 may be formed such that it is grown upward from the exposed surface of the lower electrode 106. The phase change material layer 112 may not deposit on the top surface of the interlayer insulating layer 108 and side surfaces of the interlayer insulating layer 108 inside the hole 110, i.e., the phase change material layer 112 may not grow therefrom. Accordingly, the phase change material layer 112 may fill the hole 110 without either a void or a seam.

Figure 4:
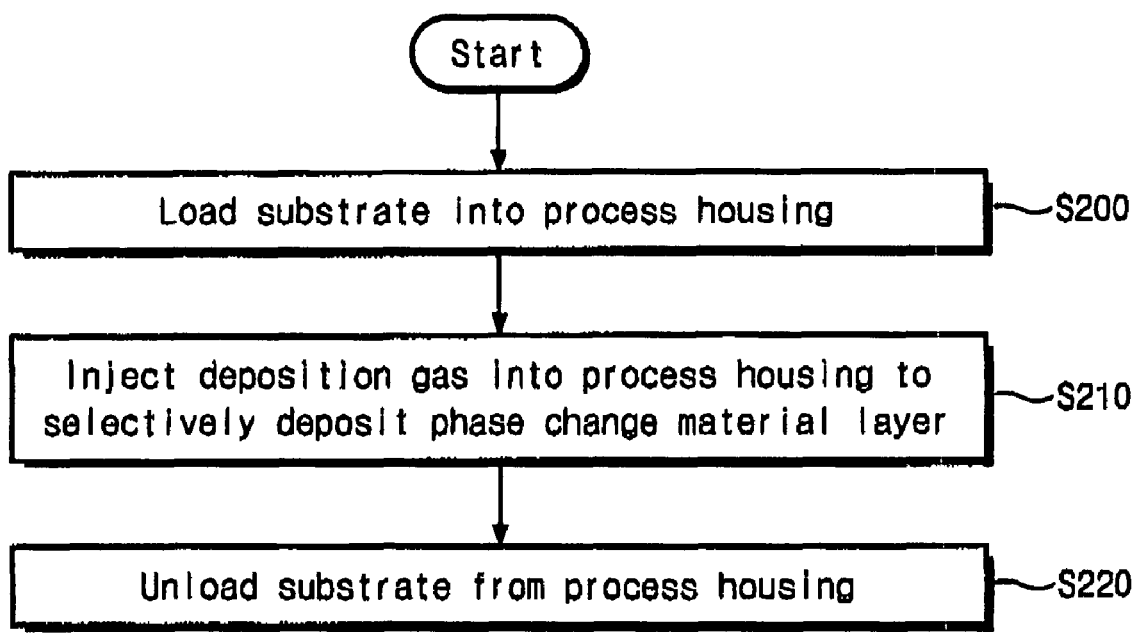
FIG. 4 illustrates a flowchart of the method of forming a phase change memory device according to a second embodiment of the present invention.
Figure 5:
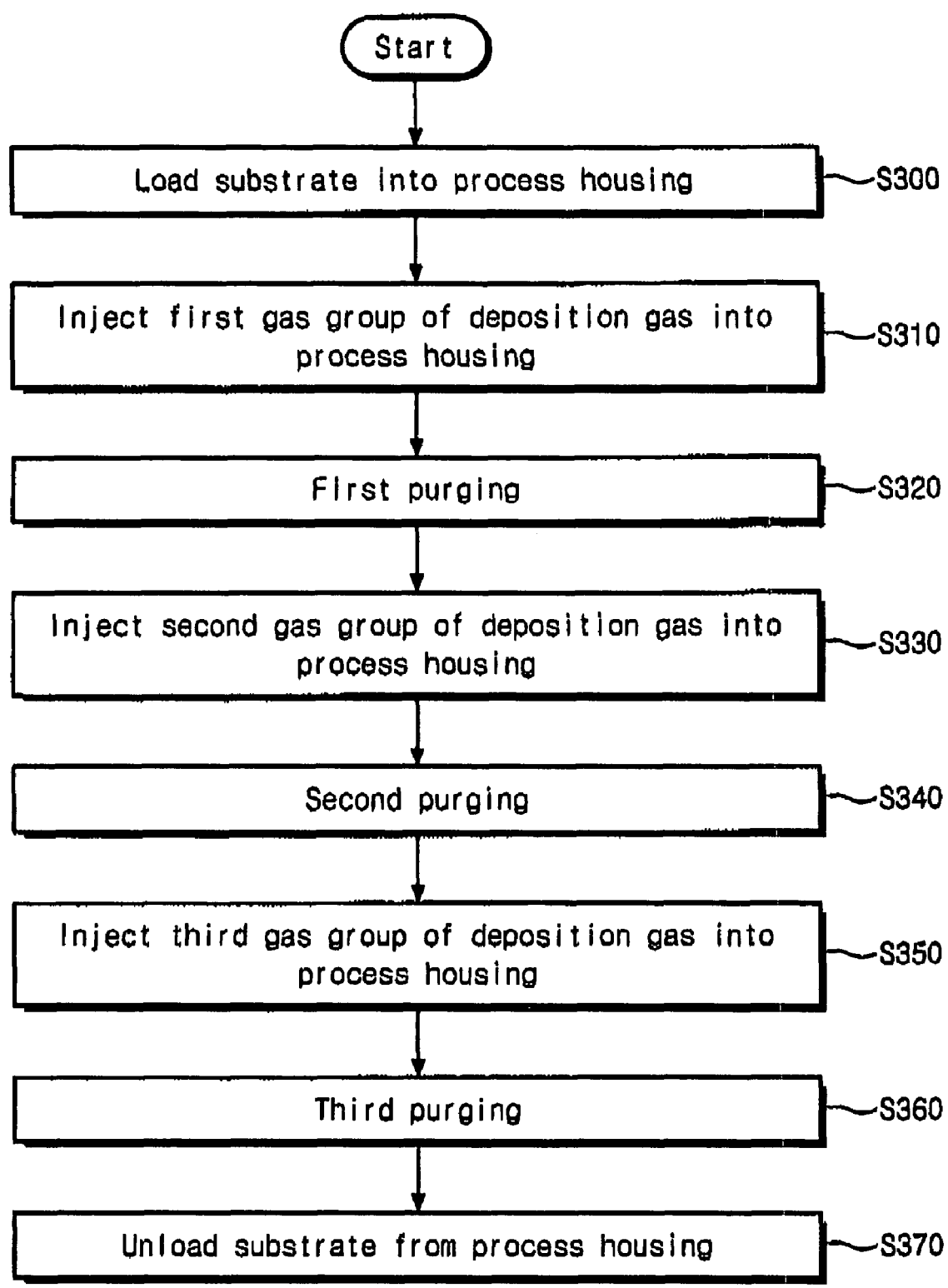
FIG. 5 illustrates a flowchart of a method of forming a phase change memory device according to a third embodiment of the present invention.

The selective deposition method of forming the phase change material layer 112 will now be described in greater detail in connection with FIGS. 4-7. FIG. 4 illustrates a flowchart of a method of forming the phase change memory device according to a second embodiment of the present invention, FIG. 5 illustrates a flowchart of a method of forming a phase change memory device according to a third embodiment of the present invention, FIG. 6 illustrates a schematic view of a deposition apparatus, and FIG. 7 illustrates a schematic view of another deposition apparatus.

Figure 6:
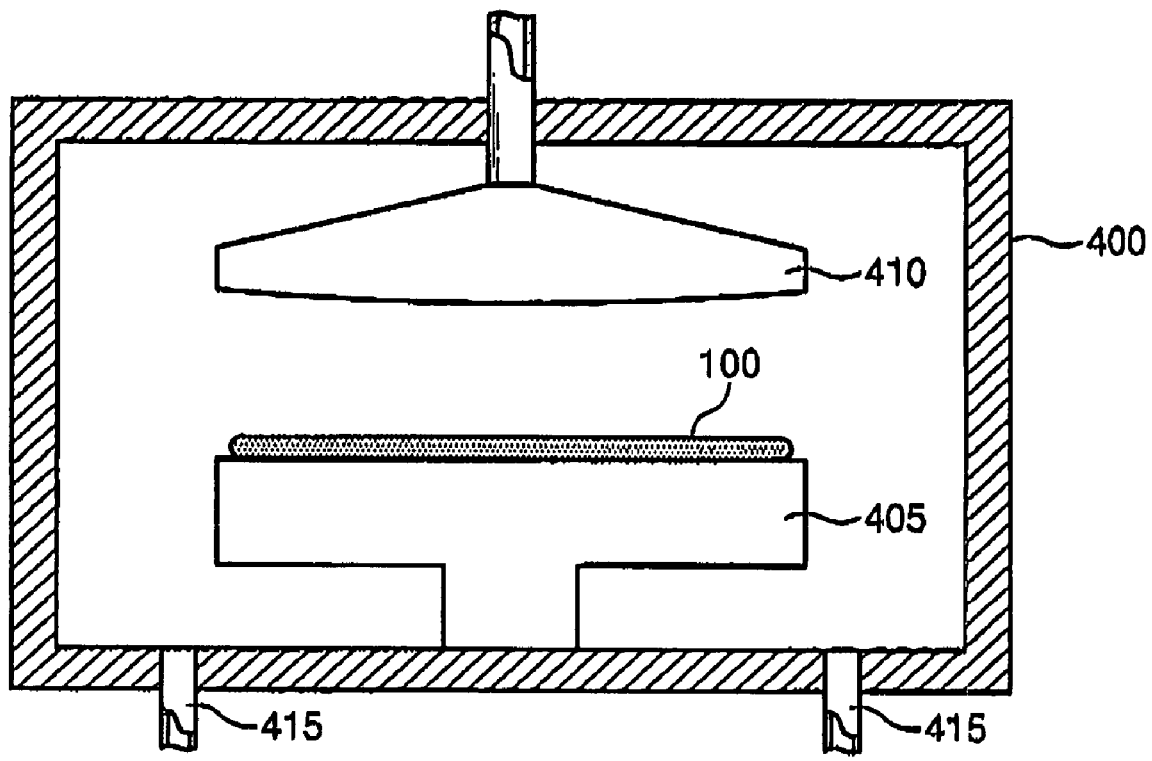
FIG. 6 illustrates a schematic view of a deposition apparatus.
Figure 7:
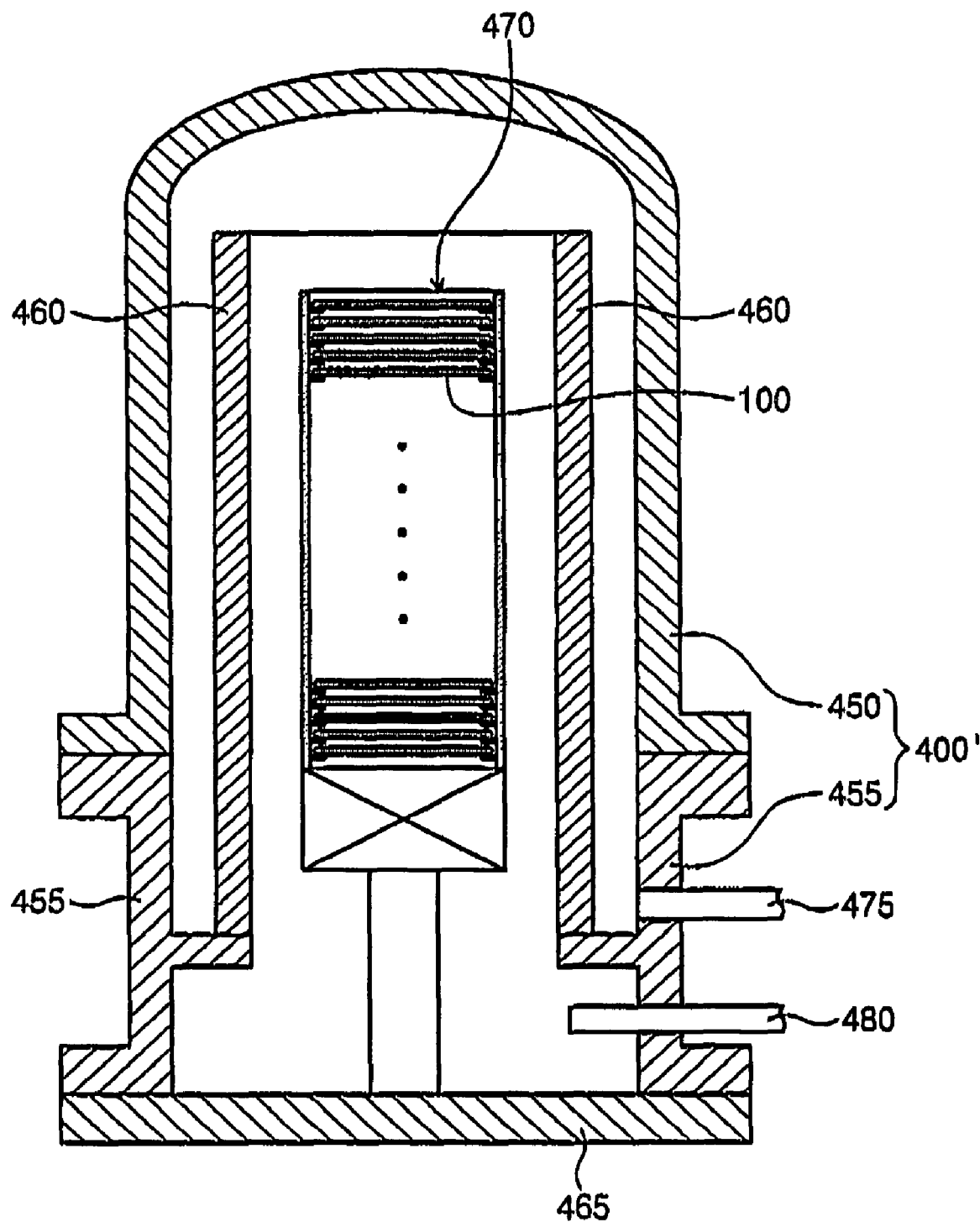
FIG. 7 illustrates a schematic view of another deposition apparatus.

The deposition apparatus illustrated in FIG. 6 may include a process housing 400 having an inner space in which a deposition process may be performed. A chuck 405 having a top surface for supporting the substrate 100 may be disposed in the process housing 400, and the substrate 100 may be loaded on the chuck 405. A gas supply unit 410 may be disposed in the process housing 400, in order to supply a deposition gas to the substrate 100 loaded on the chuck 405. The gas supply unit may be, e.g., a shower head-type 410, as illustrated in FIG. 6. The gas supply unit 410 may be disposed above and spaced apart from the chuck 405. In the case of a shower head-type gas supply unit 410, the gas supply unit 410 may include a plurality of gas nozzles. In another implementation (not shown), the gas supply unit may have different shape, e.g., the gas supply unit may be a plurality of gas supply pipes that pass through the process housing 400, wherein the plurality of gas supply pipes are spaced apart from one another. One or more exhaust pipes 415 may pass through the process housing 400.

A selective deposition method for selectively forming the phase change material layer 112 on the substrate 100 will now be described in connection with the above-described deposition apparatus and the flowchart illustrated in FIG. 4.

First, the substrate 100 having the hole 110 therein may be loaded into the process housing 400 (S200). In detail, the substrate 100 may be loaded on the top surface of the chuck 405. In an implementation, the chuck 405 may be a unit that can supply heat to achieve a predetermined process temperature for the deposition process. The chuck 405 may directly supply the heat to the substrate 100.

A deposition gas may be injected into the process housing 400 so as to selectively deposit the phase change material layer 112 (S210). The phase change material layer 112 may be formed of, e.g., a compound having one or more of tellurium (Te) or selenium (Se), which are chalcogenides, and one or more of Ge, Sb, Bi, Pb, Sn, Ag, As, S, Si, P, O, or N. As particular examples, the phase change material layer 112 may include Ge—Sb—Te, As—Sb—Te, As—Ge—Sb—Te, Sn—Sb—Te, Ag—In—Sb—Te, In—Sb—Te, a group 5A element-Sb—Te, a group 6A element-Sb—Te, a group 5A element-Sb—Se, a group 6A element-Sb—Se, etc. As described above, the phase change material layer 112 may be a compound containing a plurality of elements, and, therefore, the deposition gas may include various source gases.

The lifetime of the deposition gas is defined as the time that the deposition gas exists in the process housing 400. In addition, a thermal reaction time is defined as the time the deposition gas takes to react by means of thermal energy, and the lifetime of the deposition gas may be shorter than the thermal reaction time. The reaction of the deposition gas may include decomposition and/or combination of source gases contained in the deposition gas. Since the lifetime is shorter than the thermal reaction time, the deposition gas does not react by thermal energy. A plurality of excess electrons may exist in the conductive lower electrode 106, and the deposition gas may react by the excess electrons so as to form the phase change material layer 112, i.e., through an electron transfer reaction, such that the deposition gas reacts by the excess electrons in the surface of the lower electrode 106 exposed by the hole 110 to form the phase change material layer 112. Accordingly, the phase change material layer 112 may be grown upward from the exposed surface of the lower electrode 106.

The interlayer insulating layer 108 may be formed of insulating material having no excess electrons therein. Accordingly, the phase change material layer 112 may not grow from or be deposited on the surface of the interlayer insulating layer 108, i.e., the phase change material layer 112 may not grow from or be deposited on the sidewalls of the hole 110 in the interlayer insulating layer 108 or on the top surface of the interlayer insulating layer 108.

The electron reaction time is defined as the time the deposition gas takes to react by means of the excess electrons in the base layer. The electron reaction time may be significantly shorter than the thermal reaction time, and the lifetime of the deposition gas may be longer than the electron reaction time. By shortening the lifetime of the deposition gas relative to the thermal reaction time, the deposition gas may react only on the exposed surface of the lower electrode 106 because of the excess electrons of the lower electrode 106. Accordingly, the phase change material layer 112 may be selectively formed on the exposed surface of the lower electrode 106 and may not be formed on the surface of the interlayer insulating layer 108. Thus, the phase change material layer 112 may be grown upward from the exposed surface of the lower electrode 106 so that the phase change material layer 112 may fill the hole 110 without either void or seam.

The lifetime of the deposition gas in the process housing 400 may be controlled using the inflow of deposition gas and the outflow of gas exhausted from the deposition housing 400. For example, when the inflow of deposition gas is greater than the outflow of exhausted gas, the lifetime may be increased, whereas when the inflow of deposition gas is less than the outflow of exhausted gas, the lifetime may be decreased.

The lifetime of the deposition gas may also be controlled using the process temperature. For example, the lifetime of the deposition gas may be increased by lowering the process temperature, such that, as the process temperature decreases, the thermal reaction time increases. Increasing the thermal reaction time may increase the lifetime. Thus, the lifetime may be determined by one or more factors including the inflow and outflow rates of the gas, and the process temperature.

In an implementation, the phase change material layer 112 may be formed of Ge—Sb—Te (GST). In this case, the source gases contained in the deposition gas may include, e.g., GeH(i-Bu)$_3$, Sb(i-Pr)$_3$ and Te(t-Bu)$_2$, and the process temperature may be about 350° C. In this case, the lifetime may be about 1 second. Thus, the phase change material layer 112 may be grown upward from the exposed surface of the lower electrode 106 so that it fills the hole 110 without either void or seam. In this case, when reducing the process temperature to 350° C. or below, the lifetime may be increased to one second or more.

After forming the phase change material layer 112, the substrate 100 may be unloaded from the process housing 400 (S220).

The deposition apparatus of FIG. 6 is a single wafer type deposition apparatus for performing the selective deposition process on one substrate 100 at a time. However, embodiments of the present invention are not limited thereto, and the selective deposition method may be performed using other deposition apparatuses having different shapes.

FIG. 7 illustrates a schematic view of another deposition apparatus. Referring to FIG. 7, the deposition apparatus may include a process housing 400'. The process housing 400' may be configured with a flange 455 having an inner space of which top and bottom are opened, and an outer tube 450 mounted on the flange 455. The outer tube 450 may have an inner space in communication with the inner space of the flange 455. A top portion of the outer tube 450 may be closed. An inner tube 460 may be disposed inside the outer tube 450. The inner tube 460 may be mounted on protrusions formed on inner walls of the flange 455. The inner tube 460 and the outer tube 450 may be spaced apart from each other. The inner tube 460 may have an inner space, and top and bottom portions of the inner tube 460 may be open. A gas exhaust pipe 475 and a gas inlet pipe 480 may be mounted on the flange 450. When the deposition process is performed in the process housing 400', heat for achieving a predetermined process temperature may be supplied into the process housing 400' by means of a heating unit (not shown), e.g., a heating unit surrounding an outer wall of the outer tube 450.

In performing the selective deposition process, a substrate support unit 470 may be mounted in the inner tube 460. In detail, the substrate support unit 470 may be mounted on a plate 465, and the plate 465 may be mounted on a bottom portion of the flange 450 so as to seal up the process housing 400'. A plurality of substrates 100 may be loaded on the substrate support unit 470 at the same time. The selective deposition process described in connection with FIG. 4 may be performed using the deposition apparatus of FIG. 7.

Referring to FIGS. 2, 4 and 7, the plurality of substrates 100 having the respective holes 110 therein may be loaded on the substrate support unit 470. Thereafter, the substrate support unit 470 may be mounted in the inner tube 470, and the substrates 100 may then be loaded into the process housing 400'. Thereafter, the deposition gas may be injected into the process housing 400' through the gas inlet pipe 480 so that the phase change material layer 112 is selectively deposited on the lower electrode 106 exposed by the hole 110.

In performing the selective deposition process, the lifetime of the deposition gas is defined as the time that the deposition gas exists in the process housing 400', and the thermal reaction time of the deposition gas is defined as the time the deposition gas takes to react by means of thermal energy. Where the lifetime of the deposition gas is shorter than the thermal reaction time, the deposition gas does not react by the thermal energy. Accordingly, the phase change material layer 112 may be selectively deposited such that it is grown upward from the exposed surface of the lower electrode 106, as described above. The lifetime of the deposition gas may be longer than the electron reaction time. After forming the phase change material layer 112, the substrates 100 may be unloaded from the process housing 400'.

The deposition apparatus of FIG. 7 is a batch-type deposition apparatus configured to simultaneously perform the selective deposition process on the plurality of substrates 100. By performing the selective deposition process using the batch type deposition apparatus, it may be possible to significantly enhance the productivity of the phase change memory device. In addition, the substrate support unit 470, and the outer and inner tubes 450 and 460 may be formed of quartz. Since the quartz is an insulating material, the phase change material layer 112 may not be formed on the surfaces of the substrate support unit 470, the outer tube 450, and the inner tube 460. Therefore, a cleaning period of the batch type deposition apparatus may be lengthened and thereby improve productivity. The batch type deposition apparatus of FIG. 7 may correspond to a longitudinal deposition apparatus in which the substrates 100 are stacked in sequence. In another implementation, the selective deposition process may be performed using a batch type horizontal deposition apparatus.

Referring again to FIG. 4, in the selective deposition method, a plurality of source gases may be simultaneously injected into the process housing. In another implementation, the selective deposition process may be performed alternately, as will be described in connection with FIG. 5. In this case, the selective deposition process may also be performed using the deposition apparatus of FIG. 6.

FIG. 5 illustrates a flowchart of a method of forming a phase change memory device according to a third embodiment of the present invention. Referring to FIGS. 2, 5 and 6, the substrate 100 having the hole 110 exposing the lower electrode 106 may be loaded into the process housing 400 (S300). Herein, the substrate 100 may be loaded on the top surface of the chuck 405.

Referring to FIG. 5, the deposition gas may be supplied as a plurality of source gases that are grouped into a plurality of gas groups each having at least one source gas. In this embodiment, the deposition gas may contain a first, a second and a third group of gases. In other implementations, the deposition gas may include two gas groups, four gas groups, or more. Where the phase change material layer 112 is a GST, one of GeH(i-Bu)$_3$, Sb(i-Pr)$_3$, and Te(t-Bu)$_2$ may be in the first gas group, another one of them may be in the second gas group, and the remaining one of them may be in the third gas group. A first gas group of the deposition gas may be injected into the process housing 400 (S310). Subsequently, a first purging may be performed to purge the process housing 400 (S320). The first purging (S320) may be performed using purge gas containing inert gas.

The lifetime of the first gas group in the process housing 400 may be shorter than the thermal reaction time. Accordingly, the first gas group may react by the excess electrons of the lower electrode 106. The first gas group may react by the excess electrons, e.g., be decomposed by the excess electrons, so that it deposits only on the exposed surface of the lower electrode 106 and does not deposit on the surface of the interlayer insulating layer 108. The lifetime of the first gas group may be longer than the electron reaction time.

The lifetime of the first gas group may be determined by controlling, e.g., the inflow and/or inflow rate of the first gas group, or the outflow and/or outflow rate of the gas in the process housing 400. In addition, the lifetime of the first gas group may be determined by controlling the process temperature. Further, the lifetime of the first gas group may be determined using the inflow and inflow rate of the purge gas at the first purging (S320) and a time interval between the injecting of the first gas group (S310) and the first purging (S320). Of course, the lifetime of the first gas group may be determined by combination of the above control methods.

Next, a second gas group of the deposition gas may be injected into the process housing 400. A second purging may be performed to purge the process housing 400, e.g., using purge gas containing inert gas. The lifetime of the second gas group may also be shorter than the thermal reaction time. The lifetime of the second gas group may be longer than the electron reaction time. Accordingly, the second gas group may react only on the exposed surface of the lower electrode 106. Thus, upon the exposed surface of the lower electrode 106, there may exist an intermediate compound formed from the first and second gas groups.

The lifetime of the second gas group may be controlled in the same manner as the lifetime of the first gas group. That is, the lifetime of the second gas group may be controlled by controlling the inflow and/or inflow rate of the second gas group, the outflow and/or outflow rate of the gas in the process housing 400, the process temperature, the inflow and inflow rate of the purge gas at the second purging (S340) and a time interval between the injecting of the second gas group (S330) and the second purging (S340), etc. The lifetime of the second gas group may be controlled by combination of the above control methods.

Next, the third gas group may be injected into the process housing 400 (S350), and a third purging may be performed to purge the process housing 400. The lifetime of the third gas group may be shorter than the thermal reaction time. In addition, the lifetime of the third gas group may be longer than the electron reaction time. Accordingly, the third gas group may react only on the exposed surface of the lower electrode 106. Thus, the phase change material layer 112 may be formed on the exposed surface of the lower electrode 106. Controlling the lifetime of the third gas group may be performed in the same manner as for the first and second gas groups.

The phase change material layer 112 formed through the above-described processes (S310 through S360) may have a thickness near the thickness of an atomic layer. Therefore, in order to fill the phase change material layer 112 into the hole 110, the above-described processes (S310 through S360) may be performed repeatedly.

After forming the phase change material layer 112 to fill the hole 110, the substrate 100 may be unloaded from the process housing 400.

Since the lifetime of the deposition gas according to the selective deposition method illustrated in the flowchart of FIG. 5 may be shorter than the thermal reaction time, the phase change material layer 112 may grow upward from the exposed surface of the lower electrode 106 and may not grow from the surface of the interlayer insulating layer 108. Accordingly, the phase change material layer 112 may fill the hole 110 without either void or seam, which may yield a phase change material layer that is significantly more uniform and defect free than a conventionally prepared layer.

Referring again to FIG. 2, the phase change material layer 112 may be formed such that it protrudes upwards higher than the top surface of the interlayer insulating layer 108. That is, the phase change material layer 112 may be formed with a lower portion filling the hole 110 and an upper portion protruding higher than the top surface of the interlayer insulating layer 108. Referring to FIG. 3, a planarization may be performed to remove the protrusion of the phase change material layer 112 so that the phase change material layer 112 is changed to a phase change pattern 112a, which is only formed to fill the hole 110. The removal of the protrusion of the phase change material layer 112 may be performed by, e.g., an etch-back or chemical mechanical polishing (CMP) process. In another implementation, the phase change material layer 112 may be deposited such that its top surface is as high as the top surface of the interlayer insulating layer 108. In this case, the planarization process may be omitted, and, thus, the phase change material layer 112 may be directly used as the phase change pattern 112a.

An upper electrode 114 may be formed on the interlayer insulating layer 108. The upper electrode 114 may be in contact with the phase change pattern 112a. The upper electrode 114 may be formed of conductive material. For instance, the upper electrode 114 may be formed of one or more of a transition metal, a conductive transition metal nitride, a conductive ternary nitride, etc. The transition metal may include one or more of, e.g., titanium (Ti), zirconium (Zr), hafnium (Hf), vanadium (V), niobium (Nb), tantalum (Ta), or tungsten (W). The conductive transition metal nitride may include, e.g., one or more of titanium nitride, hafnium nitride, vanadium nitride, niobium nitride, tantalum nitride, or tungsten nitride. The conductive ternary nitride may include, e.g., one or more of titanium aluminum nitride, titanium carbon nitride, tantalum carbon nitride, titanium silicon nitride, or tantalum silicon nitride.

The resistivity of the lower electrode 106 may be different from that of the upper electrode 114. A programmed region in the phase change pattern 112a may correspond to a region between a first region adjacent to the lower electrode 106 and a second region adjacent to the upper electrode 114. As the programmed region is reduced, the amount of current required in a program and/or erase operation of the phase change memory device may be reduced. When the lower electrode 106 has a higher resistivity than the upper electrode 114, the programmed region may be the first region adjacent to the lower electrode 106, whereas when the lower electrode 106 has a lower resistivity than the upper electrode 114, the programmed region may be the second region adjacent to the upper electrode 114.

In the following description, a method of forming a phase change memory device will be described in which a lower electrode is formed to have a different shape from that of the aforementioned lower electrode 106. This method may be similar to the method as described above, and thus like reference numerals denote like elements.

Figure 8:
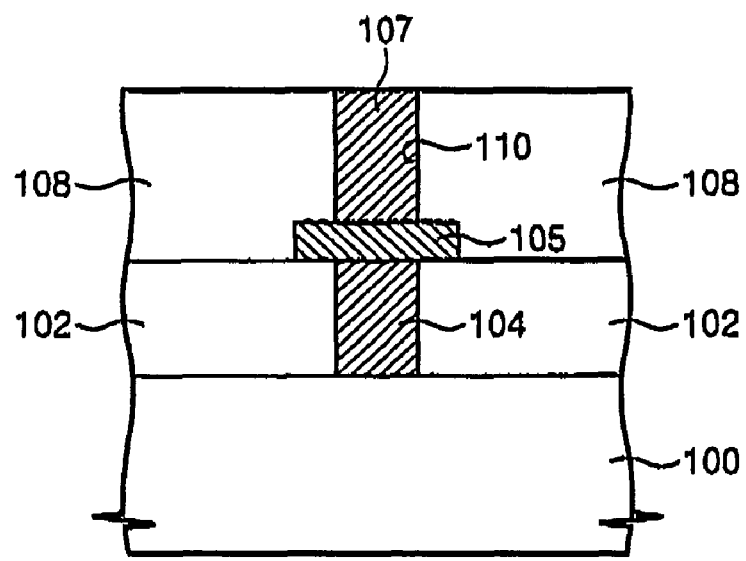
FIGS. 8 through 10 illustrate cross-sectional views of stages in a method of forming a lower electrode according to a fourth embodiment of the present invention.
Figure 9:
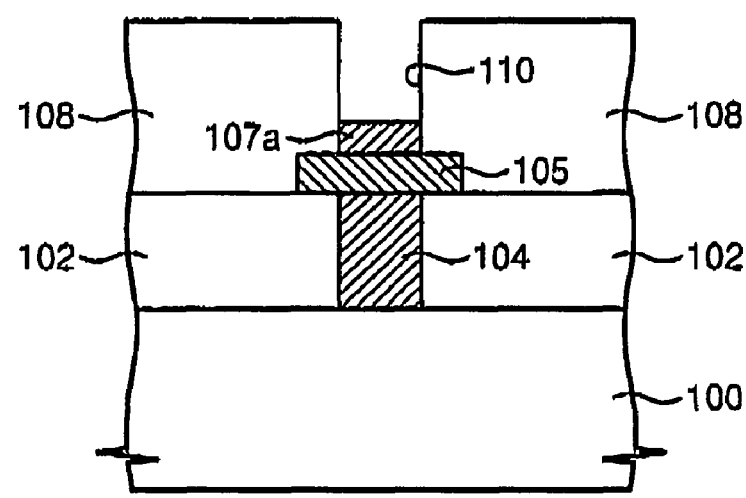
Figure 10:
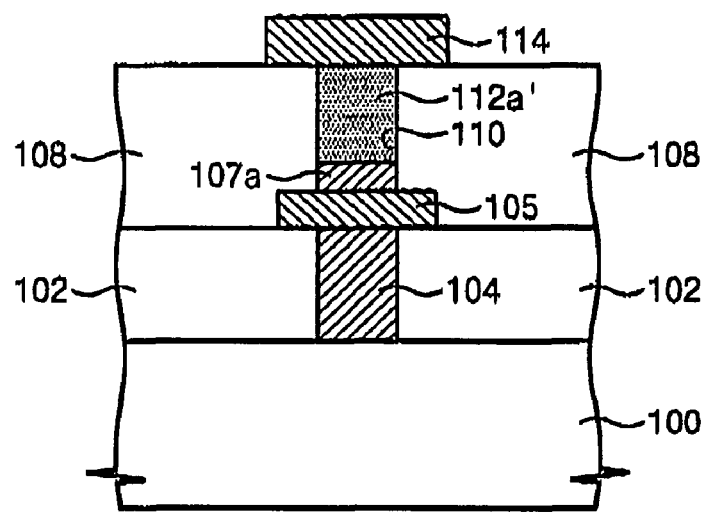

FIGS. 8 through 10 illustrate cross-sectional views of stages in a method of forming a lower electrode according to a fourth embodiment of the present invention. Referring to FIG. 8, the lower insulating layer 102 may be formed on the substrate 100, and the lower plug 104 may be formed through the lower insulating layer 102. A buffer layer 105 may be formed on the lower insulating layer 102. The buffer layer 105 may be formed of a conductive material.

The interlayer insulating layer 108 may be formed on the surface of the substrate 100 and may be patterned so as to form the hole 110 exposing a region of the buffer layer 105. The buffer layer 105 may allow for increasing an alignment margin between the hole 110 and the lower plug 104. Accordingly, depending on the requirements of the particular device and fabrication process, the buffer layer 105 may be omitted, in which case the hole 110 may expose the lower plug 104.

As shown in FIG. 8, a preliminary lower electrode 107 in the shape of a plug may be formed so as to fill the hole 110. Referring to FIG. 9, the preliminary lower electrode 107 may be etched so as to form a lower electrode 107a filling a lower portion of the hole 110 and having a top surface that is lower than the top surface of the interlayer insulating layer 108. An upper portion of the hole 110 above the lower electrode 107a may be vacant. The lower electrode 107a may include one or more of a transition metal, a conductive transition metal nitride, or a conductive ternary nitride. The transition metal may include, e.g., one or more of titanium (Ti), zirconium (Zr), hafnium (Hf), vanadium (V), niobium (Nb), tantalum (Ta), or tungsten (W). The conductive transition metal nitride may include, e.g., one or more of titanium nitride, hafnium nitride, vanadium nitride, niobium nitride, tantalum nitride, or tungsten nitride. The conductive ternary nitride may include, e.g., one or more of titanium aluminum nitride, titanium carbon nitride, tantalum carbon nitride, titanium silicon nitride, or tantalum silicon nitride. The buffer layer 105 may be formed of conductive material having a lower resistivity than the lower electrode 107a. For example, the buffer layer 105 may be formed of tungsten.

Referring to FIG. 10, a phase change pattern 112a' may be formed to fill the hole 110 over the lower electrode 107a. The phase change pattern 112a' may be formed by a selective deposition method, as described above in connection with FIGS. 4 and 5. Thus, the phase change pattern 112a' may be selectively formed such that it is grown upward from the exposed surface of the lower electrode 107a. When forming the phase change pattern 112a', a planarization process may be additionally performed, as described above in connection with FIG. 2. An upper electrode 114 may be formed on an interlayer insulating layer 114 such that it is in contact with the phase change pattern 112a'.

The resistivity of the lower electrode 107a may be different from that of the upper electrode 114. In particular, the resistivity of the lower electrode 107a may be higher than that of the upper electrode 114. Accordingly, the programmed region in the phase change pattern 112a' may be in a region adjacent to the lower electrode 107a. In program and/or erase operation, Joule heating may be primarily generated at an interface between the lower electrode 107a and the phase change pattern 112a' and, since the lower electrode 107a is disposed in the lower portion of the hole 110, the interface may be disposed in the hole 110. Therefore, it may be possible to minimize power consumption of the phase change memory device by minimizing the loss of Joule heat generated in the program and/or erase operation. In addition, the lower electrode 107a may fill the lower portion of the hole 110 so that an aspect ratio of the hole 110 may be reduced.

A phase change memory device according to an embodiment of the present invention will be described below with reference to the accompanying drawings.

Figure 11:
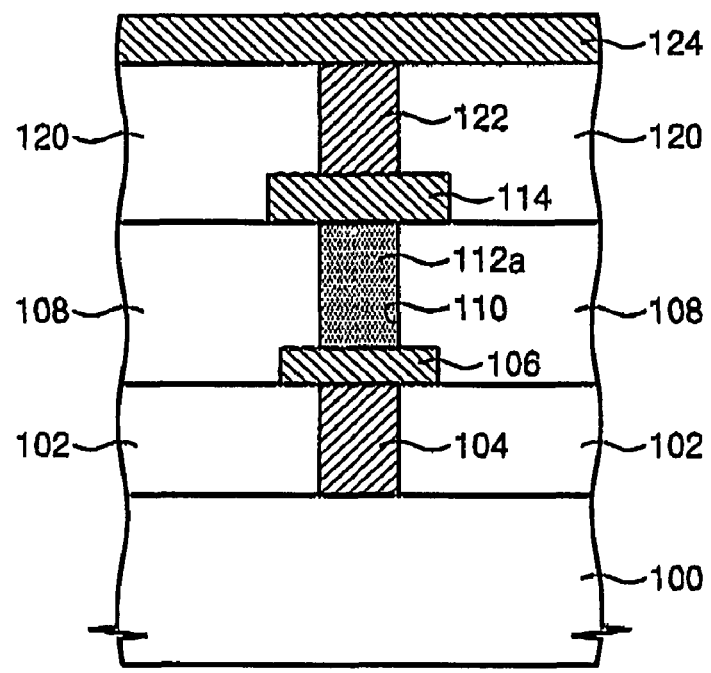
FIG. 11 illustrates a cross-sectional view of a phase change memory device according to the first embodiment of the present invention.

FIG. 11 illustrates a cross-sectional view of a phase change memory device according to the first embodiment of the present invention. Referring to FIG. 11, the lower insulating layer 102 may be disposed on the substrate 100, and the lower plug 104 may penetrate the lower insulating layer 102 to be in contact with the substrate 100. The lower electrode 106 may be disposed on the lower insulating layer 102. The lower electrode 106 may be in contact with the lower plug 104.

The interlayer insulating layer 108 may cover the surface of the substrate 100. The hole 110 may penetrate the interlayer insulating layer 108 to expose a region of the lower electrode 106. The exposed surface of the lower electrode 106 may be as high as or lower than the bottom surface of the interlayer insulating layer 108 around the hole 110. The phase change pattern 112a may fill the hole 110 without a void or a seam. The phase change pattern 112a may be grown upward from the surface of the lower electrode 106 exposed by the hole 110 by means of a selective deposition method according to an embodiment of the present invention, as described above. The bottom surface of the phase change pattern 112a may be in contact with the lower electrode 106. The upper electrode 114 may be disposed on the interlayer insulating layer 108. The upper electrode 114 may be in contact with the phase change pattern 112a.

An upper insulating layer 120 may cover the surface of the substrate 100 and the upper electrode 114. An upper plug 122 may penetrate the upper insulating layer 120 to be in contact with the upper electrode 114. An interconnection 124 may be disposed on the upper insulating layer 120. The interconnection 124 may be in contact with the upper plug 122. The interconnection 124 may correspond to a bit line. The interconnection 124 and the upper plug 122 may be formed of a conductive material.

In another implementation (not shown), the interconnection 124 and the upper plug 122 may be omitted. In this case, the upper electrode 114 may have the shape of an interconnection, extending to either side, and may correspond to a bit line.

Figure 12:
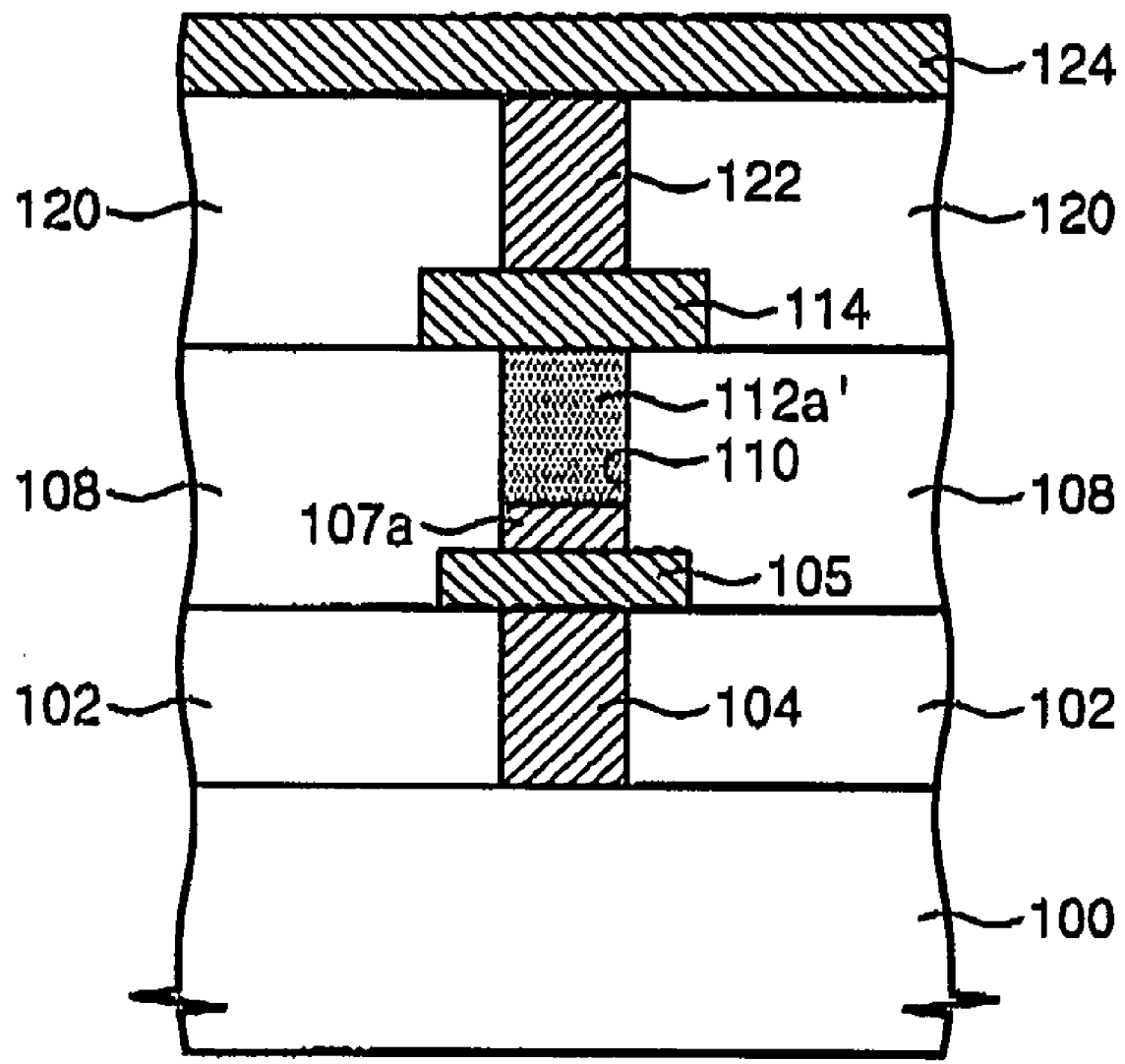
FIG. 12 illustrates a cross-sectional view of a phase change memory device according to the fourth embodiment of the present invention.

A phase change memory device with a lower electrode having a different shape will now be described with reference to FIG. 12, which illustrates a cross-sectional view of a phase change memory device according to the fourth embodiment of the present invention. Referring to FIG. 12, the lower insulating layer 102 may be disposed on the substrate 100, and the lower plug 104 may penetrate the lower insulating layer 102 to be in contact with the substrate 100. The buffer layer 105 may be disposed on the insulating layer 102, and the interlayer insulating layer 108 may cover the surface of the substrate 100 and the buffer layer 105. The hole 110 may penetrate the interlayer insulating layer 108 and may expose a portion of the buffer layer 105.

The lower electrode 107a may fill a lower portion of the hole 110, i.e., it may be confined to the lower portion of the hole 110. The bottom surface of the lower electrode 107a may be in contact with the buffer layer 105. The phase change pattern 112a' may fill the hole 110 above the lower electrode 107a without either a void or a seam. The phase change pattern 112a' may be grown upward from the top surface of the lower electrode 107a.

The upper electrode 114 may be formed on the interlayer insulating layer 108. The upper electrode 114 may be in contact with the phase change pattern 112a'. The upper insulating layer 120 may cover the surface of the substrate 100 and the upper electrode 114, and the upper plug 122 may penetrate the upper insulating layer 120 to be in contact with the upper electrode 114. The interconnection 124 may be disposed on the upper insulating layer 120 so that it is in contact with the upper plug 122. The interconnection may correspond to, e.g., a bit line. In another implementation (not shown), the interconnection 124 and the upper plug 122 may be omitted, in which case the upper electrode 114 may extend to either side so as to form a bit line.

As described above, the phase change memory device may include a lower electrode disposed on a predetermined region of a substrate, an interlayer insulating layer covering a surface of the substrate and having a hole exposing the lower electrode, a phase change pattern the hole over the exposed surface of the lower electrode without a void and a seam, and an upper electrode disposed on the interlayer insulating layer and in contact with the phase change pattern. The phase change pattern may be grown upward from the surface of the lower electrode exposed by the hole using a selective deposition method according to an embodiment of the present invention. The selective deposition method may be performed by injecting a deposition gas into a process housing in which a deposition process is performed, a lifetime the deposition gas in the process housing may be shorter than a time the deposition gas takes to react by thermal energy, and the deposition gas may react by excess electrons in the lower electrode so as to form the phase change material layer.

The interlayer insulating layer may cover the lower electrode, the hole may expose a portion of the lower electrode, and the exposed surface of the lower electrode may be as high as or lower than a bottom surface of the interlayer insulating layer around the hole. The upper electrode may be formed of a conductive material having a resistivity different from that of the upper electrode. The lower electrode may fill a lower portion of the hole, and the phase change material layer may fill the hole over the lower electrode. The phase change memory device may also include a buffer pattern between the lower electrode and the substrate, and between the substrate and the interlayer insulating layer adjacent to the lower electrode. The buffer pattern may be in contact with the lower electrode, and the buffer pattern may be formed of a conductive material having a resistivity that is lower than that of the upper electrode. The upper electrode may be formed of a conductive material having a resistivity that is different from that of the upper electrode, e.g., the resistivity of the lower electrode may be higher than the resistivity of the upper electrode. The interlayer insulating layer may be formed of, e.g., a silicon-based insulating layer containing silicon, or a metal-based insulating layer. The phase change material layer may include, e.g., Te or Se, and one or more of Ge, Sb, Bi, Pb, Sn, Ag, As, S, Si, P, O, or N.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a phase change material layer, comprising:
   preparing a substrate having an insulator and a conductor;
   loading the substrate into a process housing;
   injecting a deposition gas into the process housing to selectively form a phase change material layer on an exposed surface of the conductor; and
   unloading the substrate from the process housing,
   wherein:
   the deposition gas includes a plurality of source gases,
   the source gases are simultaneously injected into the process housing, and
   a lifetime of the deposition gas in the process housing is shorter than a time the deposition gas takes to react by thermal energy.

2. The method as claimed in claim 1, wherein:
   the conductor is formed of one or more of zirconium, hafnium, vanadium, niobium, tantalum, tungsten, hafnium nitride, vanadium nitride, niobium nitride, tantalum nitride, tungsten nitride, titanium aluminum nitride, titanium carbon nitride, tantalum carbon nitride, titanium silicon nitride, or tantalum silicon nitride, and
   the deposition gas reacts by excess electrons in the conductor to form the phase change material layer, the phase change material layer being grown upward from the exposed surface of the conductor.

3. The method as claimed in claim 2, further comprising controlling the lifetime of the deposition gas in the process housing to be longer than a time the deposition gas takes to react by the excess electrons in the conductor, the controlling including at least one of controlling a flow rate of a deposition gas and a process temperature.

4. The method as claimed in claim 1, wherein the insulator covers the entire surface of the substrate and the conductor is exposed by a hole penetrating the insulator, selectively forming the phase change material layer entailing preferentially forming the phase change material layer on the conductor relative to the insulator.

5. The method as claimed in claim 1, wherein the insulator is formed of at least one selected from the group consisting of a silicon-based insulating layer containing silicon and a metal-based insulating layer containing metal.

6. The method as claimed in claim 1, wherein the phase change material layer includes at least one of tellurium (Te) and selenium (Se), and at least one element selected from the group consisting of Ge, Sb, Bi, Pb, Sn, Ag, As, S, Si, P, O and N.

7. A method of forming a phase change material layer, comprising:
   preparing a substrate having an insulator and a conductor;
   loading the substrate into a process housing;
   injecting a deposition gas into the process housing to selectively form a phase change material layer on an exposed surface of the conductor; and
   unloading the substrate from the process housing,
   wherein:
   the deposition gas includes a plurality of source gases that are divided into a plurality of gas groups each having at least one source gas,
   the gas groups are injected into the process housing in sequence,
   a lifetime of the deposition gas in the process housing is shorter than a time the deposition gas takes to react by thermal energy; and
   the method further comprises, after the injecting of the respective gas groups into the process housing, purging the process housing with a purge gas containing an inert gas.

8. A method of forming a phase change memory device, comprising:
   forming an interlayer insulating layer covering an entire surface of a substrate, wherein a lower electrode is exposed by a hole penetrating the interlayer insulating layer;
   growing a phase change material layer upward from the exposed surface of the lower electrode using a selective deposition so as to form a phase change pattern to fill the hole over the exposed surface of the lower electrode; and
   forming an upper electrode on the interlayer insulating layer and in contact with the phase change pattern,
   wherein:
   the selective deposition includes injecting a deposition gas into a process housing in which a deposition process is performed, and
   a lifetime of the deposition gas in the process housing is shorter than a time the deposition gas takes to react by thermal energy,
   wherein the lower electrode is formed of a conductive material having a resistivity that is different from that of the upper electrode.

9. The method as claimed in claim 8, wherein:
   the lower electrode is formed of one or more of zirconium, hafnium, vanadium, niobium, tantalum, tungsten, hafnium nitride, vanadium nitride, niobium nitride, tantalum nitride, tungsten nitride, titanium aluminum nitride, titanium carbon nitride, tantalum carbon nitride, titanium silicon nitride, or tantalum silicon nitride, and
   the deposition gas reacts by excess electrons in the lower electrode to form the phase change material layer.

10. The method as claimed in claim 9, wherein the lifetime of the deposition gas in the process housing is longer than a time that the deposition gas takes to react by the excess electrons in the lower electrode.

11. The method as claimed in claim 8, wherein forming the interlayer insulating layer and the lower electrode comprises:
   forming the lower electrode on a predetermined region of the substrate;
   forming the interlayer insulating layer on the substrate having the lower electrode; and
   patterning the interlayer insulating layer to form the hole exposing the lower electrode.

12. The method as claimed in claim 8, wherein forming the interlayer insulating layer and the lower electrode comprises:
   forming the interlayer insulating layer on the substrate;
   patterning the interlayer insulating layer to form a hole;
   forming a preliminary lower electrode in the shape of a plug to fill the hole; and
   etching the preliminary lower electrode to form the lower electrode, the lower electrode filing a lower portion of the hole.

13. The method as claimed in claim 12, further comprising, before forming the interlayer insulating layer, forming a buffer pattern on a predetermined region of the substrate, wherein:
   the hole exposes the buffer pattern, and
   the lower electrode is formed on the buffer pattern exposed by the hole, the buffer pattern being formed of a conductive material having a resistivity that is lower than that of the lower electrode.

14. The method as claimed in claim 8, wherein:
   one sheet of the substrate is loaded on a chuck disposed in the process housing, and
   the selective deposition is a single wafer-type selective deposition.

15. The method as claimed in claim 8, wherein a plurality of sheets of substrates are loaded on a substrate support unit disposed in the process housing, and the selective deposition is a batch-type selective deposition.

16. The method as claimed in claim 8, wherein
   the deposition gas includes a plurality of source gases, and
   the sources gases are simultaneously injected into the process housing.

17. The method as claimed in claim 8, wherein:
   the deposition gas includes a plurality of source gases that are divided into a plurality of gas groups each having at least one source gas,
   the gas groups are injected into the process housing in sequence, and
   the method further comprises, after the injecting of the respective gas groups into the process housing, purging the process housing with a purge gas containing an inert gas.

18. The method as claimed in claim 8, wherein forming the phase change pattern comprises:
   forming the phase change material layer in the hole such that a lower portion of the phase change material layer fills the hole and an upper portion of the phase change material layer is disposed on the lower portion, the upper portion protruding higher than a top surface of the interlayer insulating layer; and
   planarizing the protruding upper portion of the phase change material layer to form the phase change pattern.

19. The method as claimed in claim 8, wherein the interlayer insulating layer is formed of at least one selected from the group consisting of a silicon-based insulating layer containing silicon and a metal-based insulating layer containing metal.

20. The method as claimed in claim 8, wherein the phase change pattern includes at least one of tellurium (Te) and selenium (Se), and at least one element selected from the group consisting of Ge, Sb, Bi, Pb, Sn, Ag, As, S, Si, P, O and N.

* * * * *